United States Patent [19]
Krasner

[11] Patent Number: 6,133,874
[45] Date of Patent: Oct. 17, 2000

[54] METHOD AND APPARATUS FOR ACQUIRING SATELLITE POSITIONING SYSTEM SIGNALS

[75] Inventor: Norman F. Krasner, San Carlos, Calif.

[73] Assignee: SnapTrack, Inc., San Jose, Calif.

[21] Appl. No.: 09/132,556

[22] Filed: Aug. 11, 1998

Related U.S. Application Data

[63] Continuation-in-part of application No. 08/845,545, Apr. 24, 1997, Pat. No. 5,945,944, and a continuation-in-part of application No. 08/759,523, Dec. 4, 1996, Pat. No. 5,841, 396, and a continuation-in-part of application No. 08/612, 582, Mar. 8, 1996, Pat. No. 5,874,914.

[51] Int. Cl.$^7$ .................................................. H04B 7/185
[52] U.S. Cl. ............................... 342/357.15; 342/357.09; 342/357.1; 342/357.12; 342/357.13; 701/213
[58] Field of Search .......................... 342/357.09, 357.1, 342/357.12, 357.13, 357.15; 701/213

[56] References Cited

U.S. PATENT DOCUMENTS

| | | | |
|---|---|---|---|
| 4,445,118 | 4/1984 | Taylor et al. | 343/357 |
| 4,622,557 | 11/1986 | Westerfield . | |
| 5,119,102 | 6/1992 | Barnard | 342/357 |
| 5,365,450 | 11/1994 | Schuchman et al. | 364/449 |
| 5,412,388 | 5/1995 | Attwood | 342/357 |
| 5,418,538 | 5/1995 | Lau | 342/357 |
| 5,459,763 | 10/1995 | Hori et al. | 375/354 |
| 5,488,378 | 1/1996 | Colley . | |
| 5,515,062 | 5/1996 | Maine et al. | 342/457 |
| 5,663,734 | 9/1997 | Krasner | 342/357 |
| 5,663,735 | 9/1997 | Eshenbach | 342/357 |

FOREIGN PATENT DOCUMENTS

| | | |
|---|---|---|
| 635728 | 1/1995 | European Pat. Off. . |
| 0902554 | 3/1999 | European Pat. Off. . |
| WO 9733382 | 9/1997 | WIPO . |
| WO 9740398 | 10/1997 | WIPO . |
| WO 98/25158 | 6/1998 | WIPO . |
| WO 9825157 | 6/1998 | WIPO . |
| WO 9832027 | 7/1998 | WIPO . |
| WO 9919743 | 4/1999 | WIPO . |

OTHER PUBLICATIONS

PCT International Search Report for PCT International Appln No. PCT/US99/16111 mailed Feb. 25, 2000 (12 pages total).

*Primary Examiner*—Theodore M. Blum
*Attorney, Agent, or Firm*—Blakely, Sokoloff, Taylor & Zafman

[57] ABSTRACT

A method and an apparatus which acquire satellite positioning system (SPS) signals in an SPS receiver. Information on time of day, approximate receiver location, and satellite positions are used to reduce the time to search and acquire signals from one or more SPS satellites. In an example of a method of the invention, a first pseudorange to a first SPS satellite is determined, and an approximate location of the SPS receiver is determined. An estimated pseudorange for a second pseudorange to a second SPS satellite is determined from the approximate location and a satellite position of the second SPS satellite. The SPS receiver then searches for SPS signals from the second SPS satellite in a range determined by the estimated pseudorange. Typically, this method reduces the search time to initially acquire SPS signals from the second SPS satellite, and the estimated pseudorange is not based on a previously determined pseudorange for said second SPS satellite. In a particular example of the invention, the approximate location is determined from a cell based information source which correlates an identification of each of various wireless cell sites with an approximate location for objects within a cell of a wireless cell based communication system, such as a cellular (or cell based) telephone system. In other examples of the invention, relatively precise time of day information may be used with information indicating satellite positions and information indicating the approximate location to determine an estimated pseudorange for a first SPS satellite to be acquired.

114 Claims, 9 Drawing Sheets

CELL BASED INFORMATION SOURCE ⤴ 201

| CELL<br>SITE # OR OTHER<br>IDENTIFICATION | CELL<br>SITE<br>LOCATION | ESTIMATED<br>LOCATION FOR OBJECTS |
|---|---|---|
| A1 (208A) | LAT./LONG. A1 | LAT./LONG. A1* (212A) |
| A2 | LAT./LONG. A2 | LAT./LONG. A2 (212B) |
| B1 | LAT./LONG. B1 | LAT./LONG. B1 |
| B2 | LAT./LONG. B2 | LAT./LONG. B2 |
| ⁝ (208) | ⁝ (210) | ⁝ (212) |

FIG. 8

| PRECISION OF TIME INFORMATION AT SPS RECEIVER 300 | POSITION INFORMATION | |
|---|---|---|
| | EPHEMERIS (FROM EXTERNAL SOURCE) PLUS SPS RECEIVER APPROXIMATE LOCATION 314 | ALMANAC PLUS SPS RECEIVER APPROXIMATE LOCATION 316<br><br>(RECEIVED AT SPS OR FROM EXTERNAL "SERVER") | SATELLITE RANGE EQUATIONS (FROM EXTERNAL SOURCE) 318 |
| PRECISE (LESS THAN 1 MILLISECOND) 320 | FIRST SATELLITE SEARCH RANGE IS REDUCED 322 | FIRST SATELLITE SEARCH RANGE IS REDUCED 324 | FIRST SATELLITE SEARCH RANGE IS REDUCED 326 |
| APPROXIMATE (>1 MILLISECOND, <10 MINUTES) 328 | MUST FIND 1ST SATELLITE BY CONVENTIONAL MEANS 330 | MUST FIND 1ST SATELLITE BY CONVENTIONAL MEANS 332 | MUST FIND 1ST SATELLITE BY CONVENTIONAL MEANS 334 |

METHOD AND APPARATUS FOR ACQUIRING SATELLITE POSITIONING SYSTEM SIGNALS

CROSS-REFERENCE TO RELATED APPLICATIONS

This application is a continuation-in-part of U.S. patent application Ser. No. 08/845,545, filed on Apr. 24, 1997 by Norman F. Krasner now U.S. Pat. No. 5,945,944, and a continuation-in-part of U.S. patent application Ser. No. 08/759,523, filed on Dec. 4, 1996 by Norman F. Krasner now U.S. Pat. No. 5,841,396, and a continuation-in-part of U.S. patent application Ser. No. 08/612,582, filed on Mar. 8, 1996 by Norman F. Krasner, now U.S. Pat. No. 5,874,914.

FIELD OF THE INVENTION

The present invention relates to receivers capable of acquiring signals from satellites used in satellite positioning systems (SPS), such as the global positioning system (GPS).

BACKGROUND OF THE INVENTION

GPS receivers normally determine their position by computing relative times of arrival of signals transmitted simultaneously from a multiplicity of GPS (or NAVSTAR) satellites. These satellites transmit, as part of their message, both satellite positioning data, so-called "ephemeris," as well as clock timing data. The process of searching for and acquiring GPS signals, reading the satellite data for a multiplicity of satellites and computing the location of the receiver from this data is time consuming, often requiring several minutes. In many cases, this lengthy processing time is unacceptable and, furthermore, greatly limits battery life in micro-miniaturized portable applications. Furthermore, under severe blockage conditions where increased receive sensitivity is required, this processing time may increase significantly.

There are two principal functions of GPS receiving systems: (1) computation of the pseudoranges to the various GPS satellites, and (2) computation of the position of the receiving platform using these pseudoranges and satellite timing and ephemeris data. The pseudoranges are simply the time delays measured between the received signal from each satellite and a local clock. Alternatively, time delay may be measured between the transmitted signal from each satellite and a local clock. Here, the position history of each satellite is used to include the path delay from the satellite to the sensor. If the time delay is then multiplied by the speed of light we get the pseudorange expressed as a distance. It becomes a true range when the time of the local clock (or clock bias) and other small timing errors are ascertained. For the purposes of the present invention, which is concerned with signal search and acquisition, we use the preceding definition of pseudorange as the time delay between a received satellite signal and a local clock. Furthermore, the pseudorange of interest herein is the time modulo the frame period of the underlying pseudorandom spreading sequence, which for the United States GPS system C/A code is 1 millisecond. Note that pseudorange should be distinguished from satellite range. Satellite range is a true distance from a satellite to an SPS receiver. In some cases the range is expressed in time units by dividing the range (in meters, for example) by the speed of light.

The satellite ephemeris and timing data is extracted from the GPS signal once it is acquired and tracked. As stated above, collecting this information normally takes a relatively long time (30 seconds to several minutes) and must be accomplished with a good received signal level in order to achieve low error rates. This invention is primarily concerned with rapid methods for determining the pseudoranges of in-view satellites, preferably all in-view satellites.

Most GPS receivers utilize correlation methods to compute pseudoranges. These correlation methods are typically performed in real time, often with hardware correlators. GPS signals contain high rate repetitive signals called pseudorandom (PN) sequences. The codes available for civilian applications are called C/A codes, and have a binary phase-reversal rate, or "chipping" rate, of 1.023 MHz and a repetition period of 1023 chips for a code period of 1 msec. The code sequences belong to a family known as Gold codes. Each GPS satellite broadcasts a signal with a unique Gold code.

For a signal received from a given GPS satellite, following a downconversion process to baseband, a correlation receiver multiplies the received signals by a stored replica of the appropriate Gold code contained within its local memory, and then integrates, or lowpass filters, the product in order to obtain an indication of the presence of the signal. This process is termed a "correlation" operation. By sequentially adjusting the relative timing of this stored replica relative to the received signal, and observing the magnitude of the correlation output, or an average of a set of successive outputs, the receiver can determine the time delay between the received signal and a local clock. The initial determination of the presence of such an output is termed "acquisition." Once acquisition occurs, the process enters the "tracking" phase in which the timing of the local reference is adjusted in small amounts in order to maintain a high correlation output. The correlation output during the tracking phase may be viewed as the GPS signal with the pseudorandom code removed, or, in common terminology, "despread." This signal is narrow band, with bandwidth typically commensurate with a 50 bit per second binary phase shift keyed data signal which is superimposed on the GPS waveform.

The correlation acquisition process is very time consuming, especially if received signals are weak. This is because a correlator must search for PN frame epoch in a serial manner over all possible 1023 chip positions of the PN code. To improve acquisition time, most GPS receivers utilize a multiplicity of correlators (up to 12 typically) which allows a parallel search over the possible epoch positions for a correlation peak.

An alternative acquisition method, described in one example of a method in U.S. Pat. No. 5,663,734, provides higher sensitivity and higher processing speed by performing a large number of FFT operations together with special, optional preprocessing and postprocessing operations. In this method, received data is downconverted to a suitable low frequency intermediate frequency, digitized and stored in a buffer memory. This data is then operated upon using, in one example, a programmable digital signal processing IC which performs the above-mentioned FFT and other operations. In effect, these operations allow for the parallel implementation of a large number of correlators (thousands). Furthermore, since the operations are performed on a single data set, or "block," they are not subject to the fluctuating signal levels and changing nature of the signal environment common to correlator approaches.

As discussed above, the first task of a GPS receiver is to determine the time-of arrivals, or pseudoranges, of each of the GPS which it can view. This is done by means of a search process. There are two major variables that need to be searched over: time and frequency. As discussed above, the pseudorandom framing structure of each GPS signal makes it necessary to search over the 1023 chips of the code to establish an initial PN frame synchronization. However, in general there will be a lack of precise knowledge of the carrier frequency of each GPS signal. Normally, this implies that a set of carrier frequencies also need to be searched over. Otherwise, an error in carrier frequency may result in a lack of a strong correlation output at all possible epoch positions. The uncertainty in carrier frequency is due to three factors: (A) Doppler associated with the satellites, which is less than ±4 kHz, (B) Doppler associated with the receiver platform if it is in motion, which is typically less than several hundred Hz, and (C) frequency errors associated with the reference oscillator (L.O.) in the GPS receiver, which can range from hundreds of Hz to tens of kilohertz, depending upon the quality of the oscillator used in the receiver. Normally, search over unknown carrier is done in increments of frequency, that are a fraction of the reciprocal of the coherent integration time of the correlator or matched filter device. This coherent integration time is equal to the number of PN frames that are compared to a locally generated reference prior to any detection operation. This number is typically in the range of 1 to 20 PN frames, that is 1 to 20 milliseconds. Coherent integration beyond 20 milliseconds is normally inadvisable since the presence of a priori unknown 50 baud binary phase shift keyed data (the satellite data message) placed on top of the signal does not allow coherent processing gain beyond one data bit period, or 20 milliseconds. As an example, then, if the receiver uses a coherent integration time of 2 milliseconds, then a suitable step across unknown frequency would be 0.5/2 milliseconds, or 250 Hz. If a range of ±10 kHz were to be searched, then a number of steps equal to around 80 would be required.

In addition to coherent processing, an acquisition receiver performs incoherent processing. That is, the output of the coherent correlation process is detected, with a square-law or linear detector, and then summed with previous outputs. This permits improved sensitivity. In fact, to detect GPS with significant blockage, a very large number of postdetection summations may be required, as many as 1000 in some cases. There is an obvious tradeoff then between sensitivity and the number of postdetection integrations performed. Note that if a single correlator is being used to acquire a GPS signal, then it will dwell for a period of 1 msec×Npred×Npostd seconds, where Npred are the number of PN frames integrated coherently and Npostd are the number of postdetections summed. In cases of high blockage this total integration time can be as much as one second. The acquisition receiver must typically search over one-half chip intervals in time over the 1023 chips periods, for a total of 2046 possible time delays. The example given before indicated that perhaps 80 different carrier frequencies would have to be searched. Thus there may have to be 163,680 different time-frequency hypotheses, or "bins" that may have to be searched to acquire a GPS signal. A single correlator would then require over 163,680 seconds to perform the search in the example just cited (1 second dwell per time-frequency bin and 80 frequency bins). Clearly this is impractical.

Traditional GPS systems trade off sensitivity for acquisition time. Thus, if a predetection integration time of 1 millisecond were used and only one postdetection integration were used, then for the above situation of 80 frequency bins, the total search time would be 163.7 seconds. This is over two minutes. To further reduce acquisition time most GPS receivers use stabilized oscillators that reduce the search requirements to around ±2 kHz and hence this would reduce the search range by a factor of 5 relative to the above example. An alternative to reducing acquisition time is to use many parallel correlators, or a matched filter approach, as discussed previously. However, note that several GPS signals need to be acquired in order to perform a position fix.

No matter what acquisition approach is employed, it is desirable to decrease the search frequency range and/or the search time range, in order to reduce the total acquisition time. Many authors have addressed methods for reducing the search frequency range (see for example U.S. Pat. No. 4,445,118). These normally revolve around having approximate knowledge of the Doppler frequencies of the GPS satellites. This can be gotten by means of an auxiliary source of such information, such as a communications link, or it may be obtained by computing such Doppler frequencies, if the GPS receiver has an approximate knowledge of time and location. In the latter case, it is assumed that the GPS receiver has stored the so-called Almanac data provided by the GPS satellites themselves. This data provides approximate satellite position versus time, which is valid for periods on the order of a month. Even with estimated Doppler, search times which are required to acquire SPS signals are often still long. Various means may also be used to reduce the uncertainty of the local frequency reference. This includes stabilizing this reference via external transmissions to the GPS receiver, using special high stability or calibrated oscillators, etc. It should be noted that the error due to oscillator instability is common to all satellite signals. Hence, once the first signal is acquired, it is usually easy to eliminate the local oscillator as a primary source of frequency instability.

It is desirable, in an SPS receiver, to limit the search range over PN epoch during initial SPS signal acquisition, that is, the search over the 1023 possible chip positions of the received GPS signals. It is noted that this should be contrasted to the case of re-acquisition in which the receiver must re-acquire GPS signals after it has recently (e.g. within several seconds) lost them. In this case the GPS receiver merely searches a range of PN epochs within the vicinity of the last determined PN epoch. Re-acquisition strategies have been part of the normal operation of GPS receivers almost since the concept of GPS was first developed.

SUMMARY OF THE INVENTION

The present invention provides various methods and apparatuses for reducing the acquisition time of signals from SPS satellites. In an example of a method of the present invention, an approximate location of the SPS receiver is determined. An estimated pseudorange for a particular SPS satellite is determined from time of day, the approximate location and satellite position information of the particular SPS satellite. The SPS receiver then searches for SPS signals from the particular SPS satellite in a range determined by the estimated pseudorange. Typically, this method reduces the search time to initially acquire SPS signals from the particular SPS satellite. In one particular example of the present invention, the approximate location is determined from a cell based information source which correlates an identification of each of various wireless cell sites with an approximate location for objects within a cell serviced by a wireless cell site in a wireless cell based communication system, such as a cellular telephone system.

In another particular example of the present invention, a server system assists a mobile SPS receiver by determining the estimated pseudoranges and causing these estimated pseudoranges to be transmitted to a mobile SPS receiver. The server may be coupled to the mobile SPS receiver through a wireless cell based communication system.

In other examples of the present invention, the time to acquire signals from SPS satellites may be reduced by determining a time of day to an accuracy of better than a framing period of the SPS signals (e.g. 1 millisecond for U.S. GPS system) and obtaining a set of mathematical expressions which specify (for a given approximate location at a given time) the estimated distance (or time of signal travel) from an SPS satellite. The time of day and the mathematical expressions determine the estimated pseudoranges around which searching may be performed to acquire SPS signals from SPS satellites.

BRIEF DESCRIPTION OF THE DRAWINGS

FIG. 8 shows an example of a cell based information source which may be used according to one aspect of the present invention.

FIG. 10 is a table which depicts alternative methods of reducing search time according to various examples of the present invention; these methods may also be used in combination.

DETAILED DESCRIPTION

The present invention provides various methods and apparatuses for reducing the time to acquire SPS signals from SPS satellites. The following description and drawings are illustrative of the invention and are not to be construed as limiting the invention. Numerous specific details are described to provide a thorough understanding of the present invention. However, in certain instances, well known or conventional details are not described in order to not unnecessarily obscure the present invention in detail.

Figure 1:
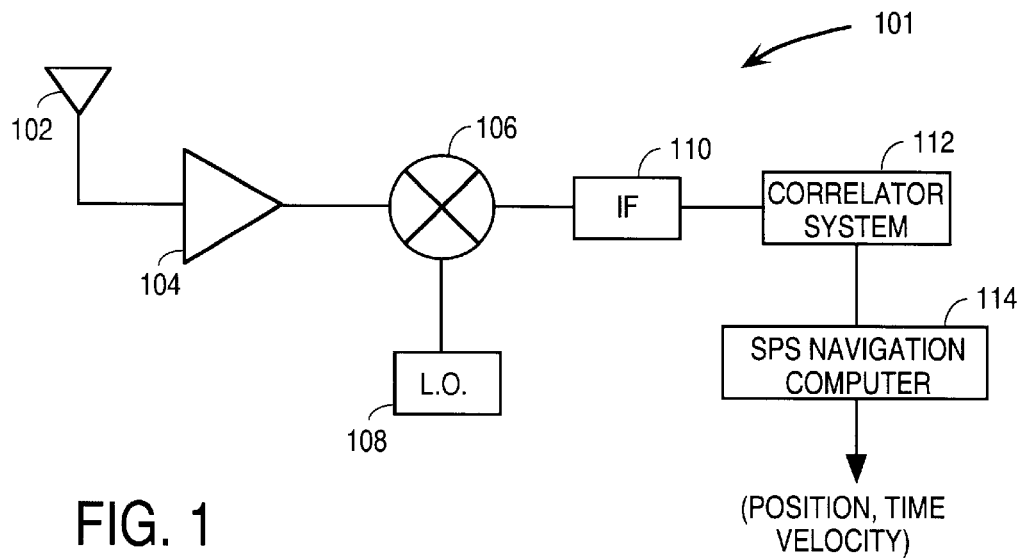
FIG. 1 shows an example of an SPS receiver which may be used with the present invention.

FIG. 1 shows an example of an SPS receiver, such as a GPS receiver, which may be used with the present invention. The receiver 101 includes an antenna 102 for receiving SPS signals. The SPS signals from the antenna 102 are provided to a low-noise amplifier 104 which amplifies the signals which are then provided to a mixer 106 which is clocked by a local oscillator 108. The mixer 106 produces downconverted SPS signals which are processed by the intermediate frequency stage 110 and are provided to the correlator system 112. The correlator system 112 is coupled to an SPS navigation computer 114. The SPS navigation computer 114 is typically controlling the operation of the correlator system 112 and the local oscillator 108 such that SPS signals are acquired and tracked and the satellite ephemeris data then read from the SPS signals in order to determine the position of the SPS receiver. The receiver 101 may be used in accordance with the present invention by, for example, using an estimated pseudorange to a particular satellite in order to reduce the time to acquire SPS signals from that satellite. Typically, such a SPS receiver will include a communication receiver which receives position aiding information or time of day information as described below, and this information is provided to the SPS navigation computer 114 which in turn uses the information in accordance with the invention to reduce the search time to acquire SPS signals from SPS satellites. The present invention may be used with SPS receivers having different receiver architectures, including for example conventional correlator receiver systems, receivers using digital signal processors with convolution algorithms (e.g. see U.S. Pat. No. 5,663,734), receivers using matched filters (e.g. see co-pending U.S. patent application Ser. No. 09/021,854, filed Feb. 11, 1998) and receivers using highly parallel correlation (e.g. see co-pending U.S. patent application Ser. No. 09/087,438, filed May 29, 1998; also see PCT International Publication No. WO 97/40398, published Oct. 30, 1997).

Two main approaches are discussed below which utilize a priori information to reduce time to search for pseudoranges. In the first approach accurate time of day information is combined with approximate user and satellite position information to restrict the range of search. In the second case only approximate time of day information is available. Then the range of search for the first satellite signal is not restricted, but must be searched in its entirety (over a 1 millisecond PN frame period). Subsequent pseudorange searches can use the pseudorange so determined for the first received signal plus approximate user and satellite positions to restrict their search ranges. This latter case is discussed in more detail below followed by the first case.

Assume that the SPS receiver has acquired one SPS signal through conventional techniques, as described above. Assume that the SPS receiver has an approximate knowledge of its location, for example within 10 miles in radius, the time of day, for example to 1 second accuracy, and the approximate satellite position vs. time, such as is provided by the Almanac. Note that if the received signal is strong enough, then the time information can be obtained from the first received signal within a period of 6 seconds (one subframe). Approximate position can be found from a prior fix or from general knowledge of location (e.g. restricting location to a city and its environment), or from auxiliary information provided to the receiver, e.g. through a communications link as in the example described below.

Figure 2:
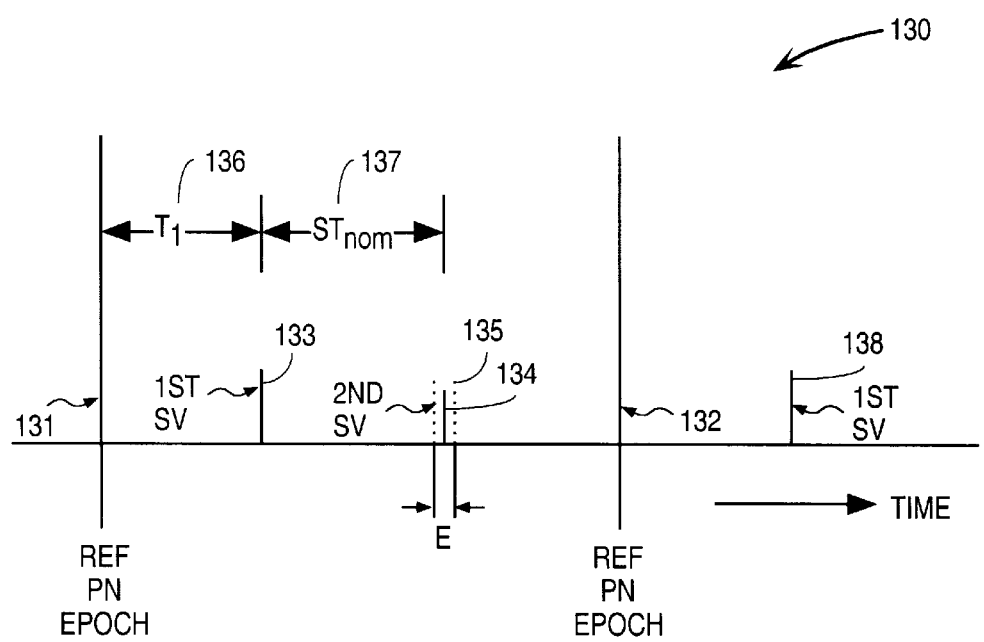
FIG. 2 shows a pictorial representation of a restricted PN search range according to one example of the present invention.

It is possible to restrict the search ranges by using the approximate position. The SPS receiver must acquire 4 SPS signals for a 3 dimensional fix and 3 signals for a 2 dimensional fix. Assume that the PN epoch is at time $T_1$, modulo 1 millisecond (the PN code repeats every 1 millisecond). Now assume that a search for a second satellite signal is proceeding. If the geographical location of the receiver were known exactly, then its PN epoch relative to $T_1$ would be known to high precision. This is the case since the remaining sources of error would be time-of-day and satellite position error. Consider these two errors. Time-of-day error results in satellite position errors. The Doppler of the GPS satellites is typically less than 2700 nsec/sec. Hence, the maximum Doppler difference between two GPS satellites is less than around ±5.4 microsec/sec. Hence, for a time error of 1 second, the resulting error between two PN epochs would be ±5.4 microseconds, or less than ±6 chips. Consider now the satellite position error. If this error is less than 2 miles radially, then the maximum time error associated with the position errors is that corresponding to the time that light travels 2 miles, or about 10 microseconds. Thus, in this example, satellite position error dominates. If we sum together these two errors we see that a maximum differential time error of ±15.4 microseconds results. This corresponds to a range of approximately ±15.4 chips and in many cases much less. Thus, under the above circumstances, we can narrow the search range by a factor of about 1023/(2×15.4)=33.2. Furthermore, by doing the search in a serpentine manner starting with the expected PN epoch for the second satellite, one can, on average, reduce this search time much more. This improved speed is such that the total search and acquisition time for all signals from GPS satellites, other than the first satellite, should not be appreciably more, and often less, than that for the first satellite. An example of the invention is shown pictorially in FIG. 2.

Each of the "pulses" 133, 134 and 138 of this figure represents the time of arrival of the epoch of satellite vehicle's signal (SV). The large vertical lines 131 and 132 represent the PN epochs of the (receiver's) locally generated PN signal. The time $T_1$ 136 is measured by the receiver and is based upon the measured time-of-arrival of the first SV signal relative to reference PN epoch 131. Once $T_1$ is determined the estimated time of arrival of the second satellite signal can be made. This is shown as an offset $\delta T_{nom}$ 137 relative to the measured time $T_1$. $\delta T_{nom}$ is computed by the formula $(R_2-R_1)/c$, where $R_1$ is the estimated range from the estimated receiver position on earth to the first GPS satellite and $R_2$ is the estimated range from the estimated receiver position on earth to the second GPS satellite both using the estimated time-of-day, and where c is the speed of light. As discussed above, the estimated GPS satellite positions, estimated time-of-day and estimated receiver position are all in error to some extent, with the major error normally associated with receiver position. The area 135 around the position $T_1+\delta T_{nom}$ represents the uncertainty in the time-of-arrival of the PN epochs from the second satellite due to these errors. This is also shown as the range or region E. As illustrated above, this typically may be on the order of tens of microseconds. Since only the region E need be searched for the second SV pseudorange, it is obvious that a great reduction in search time is achieved, relative to searching for time-of-arrival between adjacent PN epochs.

Figure 3:
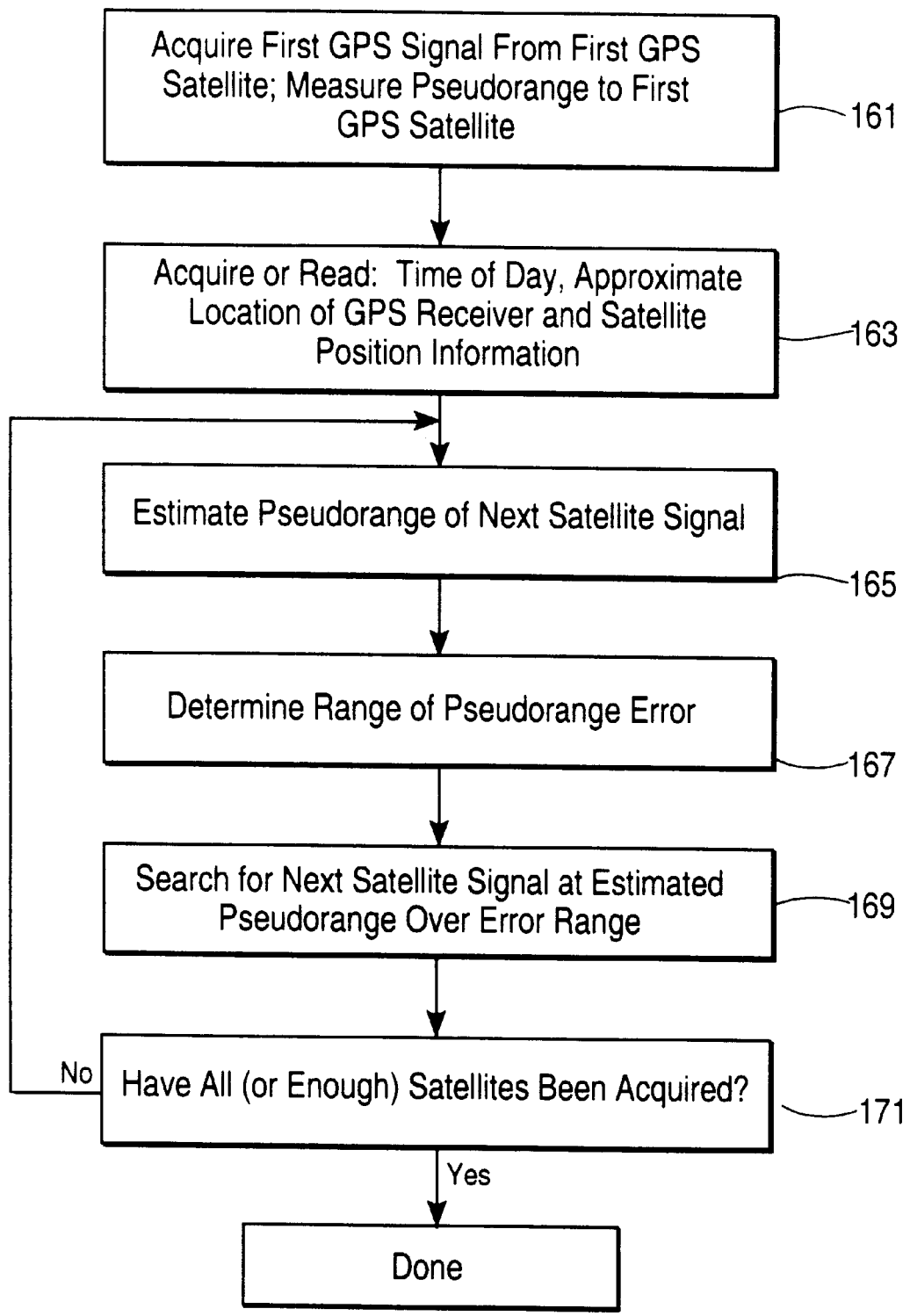
FIG. 3 shows a flowchart depicting an example of a method according to the present invention.

FIG. 3 is a flowchart showing the steps in acquiring the pseudoranges in one example of an efficient manner described above. The processing begins with the acquisition of the first GPS signal in step 161 and the determination of a pseudorange to the corresponding satellite which is transmitting this first signal. Once this is done the time-of-day may be obtained by reading the satellite data message from this signal or by having such data transmitted from an external source to the receiver. Alternatively, the receiver may have been maintaining a good estimate of time of day using an elapsed time counter. The receiver retrieves in step 163 the approximate user position and satellite position information either from stored information gathered in the past (e.g. almanac data) or via a transmission of such information via a communication link (or even manual entry). From this information the estimated pseudorange (modulo 1 millisecond periods) is estimated in step 165 and a bound on the error (e.g. error range) of this estimate is made in step 167 based upon the errors in the receiver position, time of day, and quality of the satellite position information. The receiver then searches in step 169 the restricted range of possible pseudorange equal to the estimated pseudorange plus and minus the error range. Normally in initial acquisition, the estimated pseudorange is not based on a previously determined pseudorange for the particular SPS satellite. This process is normally repeated for all satellites, in step 171, until they all are acquired. Note that once three satellite signals are acquired, one can normally compute a two-dimensional position fix, which will greatly reduce the position error of the receiver. This information can then be used to further reduce the pseudorange search region for subsequent SV's.

The above approach is especially advantageous when the error due to local oscillator instability does not dominate the acquisition time of the first satellite. Then, the search time is dominated by the search over satellite Doppler and, of course, unknown PN epoch. Thus the approach discussed above can potentially reduce acquisition time of all satellites by an amount approaching M, where M are the number of satellites to be acquired. Further, the various methods and apparatuses of the invention may be used with techniques for providing a stable local oscillator signal which is used to acquire GPS signals, such as those techniques described in copending U.S. patent application Ser. No. 08/612,582 filed Mar. 8, 1996 and copending U.S. patent application Ser. No. 08/759,523 filed Dec. 4, 1996 (both of these applications are hereby incorporated herein by reference).

The method described above dramatically reduces the time to acquire the second and subsequent satellite signals, but does not reduce the time to acquire the first satellite signal. In the example cited above, subsequent GPS signals would be acquired in ⅓₃ the time of the first. Hence if the first signal required acquisition time D, and 6 signals total were to be acquired, then the total acquisition time would be (1+5/33)D versus 6D if a straightforward search were performed, a savings of a factor of 5.21. In many situations much better improvement can be made if the first signal can be acquired more rapidly. This requires some precise knowledge of absolute time (e.g. less than 100 microsecond error) at the GPS receiver. This can often be done by means of a time transfer mechanism. We assume here that the receiver has approximate knowledge of its position and approximate satellite position information (satellite Almanac).

Such a time transfer mechanism is possible by means of an auxiliary communication link from an outside source to the GPS receiver. There are a number of instances of this. The first example is the IS-95 CDMA spread spectrum cellular telephone standard, which provides timing information that is accurate to approximately 1 microsecond, plus any propagation delays from the cellular basestation to the cellular telephone and signal processing delays within the telephone itself. A distance of 5 miles from the cell site to the telephone, which represents a relatively long path delay, results in a time delay of around 26 microseconds. If the GPS receiver assumes a mean path delay of 13 microseconds, then an error of ±13 microseconds results. It is reasonable to assume that the worst case time transfer error is such a system can be kept below around ±20 microseconds. Since the total PN frame duration is 1 millisecond, this reduces the search time for the first satellite by a factor of 26, if a standard correlator system were used. Again, using the previous example we would get a total search time of approximately D/26+5D/33 or 0.19D versus 6D with no restriction in time search, or a savings of a factor of 31.6. This is approximately ⅙ the search time required if only absolute time were available.

Other time-transfer mechanisms may be available in specialized cases. A dedicated communication link may be established to provide timing signals to a local area. Certain broadcast signals, such as WWW and its variations, provide timing information, but the accuracy of these signals may not be sufficient to allow significant reduction in acquisition time. Many additional CDMA type cellular systems are currently being proposed as world wide standards and some of these systems may incorporate time transfer mechanisms.

In the above description, precision time-of-day (less than 100 microsecond error, for example) was used together with approximate position and knowledge of satellite positions to find the first pseudorange unambiguously. The other pseudoranges are then found via a computation of time offsets from this first pseudorange and the approximate satellite positions. Of course, it is possible to treat each pseudorange corresponding to each received satellite signal separately and hence search for each pseudorange without reference to the others. This may incur unneeded search time, however, especially if the error in absolute time dominates. For example, suppose the absolute time is in error by 50 microseconds and suppose all other sources of error (e.g. approximate location error) are 20 microseconds. Then the search for the first pseudorange requires search over a range of at least 70 microseconds. If one then searched for the second pseudorange independently, it would again require a search range of over 70 microseconds. However, relative to the position of the first pseudorange the range of search for the second would only be 20 microseconds. Stated another way, the search for the first pseudorange reduced the search range, relative to a local clock in the receiver, by the 50 microsecond timing error. Hence, subsequent searches can take advantage of this reduction in search range.

Another embodiment of the present invention uses a server system. Some mobile GPS systems operate together with a remote server. Typically, the mobile GPS receiver computes pseudoranges and sends these to the server for a final computation of position. This setup allows for increased receiver sensitivity since the receiver need not read the GPS satellite data message, a task that requires fairly high received signal-to-noise ratio. In this situation communication with the server allows the server to provide information to the GPS receiver that help restrict its range of search. U.S. Pat. No. 5,663,734 describes a system which includes a server and a mobile GPS receiver. The flowchart of operation can proceed just as in FIG. 3 except that the server computes the estimated pseudorange of all SV signals relative to the first one to be searched. That is, the operation of the processing blocks 163, 165 and 167 of FIG. 3 are performed at the server. This can be done since the server, assumed to be in proximity to the GPS receiver or else know its approximate location, knows the time-of-day, approximate user location and satellite position information. Hence, the server can send the estimated pseudoranges to the GPS receiver relative to the first GPS SV signal to be searched. After the operations of FIG. 3 are complete, the GPS receiver sends time-tagged pseudoranges to the server, which completes the position calculation. This latter time-tagging need only be to an accuracy of about several milliseconds and is needed to perform the final position calculation accurately. The time tagging is needed so that the approximate position of the GPS satellites are known when the pseudoranges are measured. Again, this time tagging can be done using received signals at the GPS receiver, such as those available on a CDMA cellular network.

Figure 4:
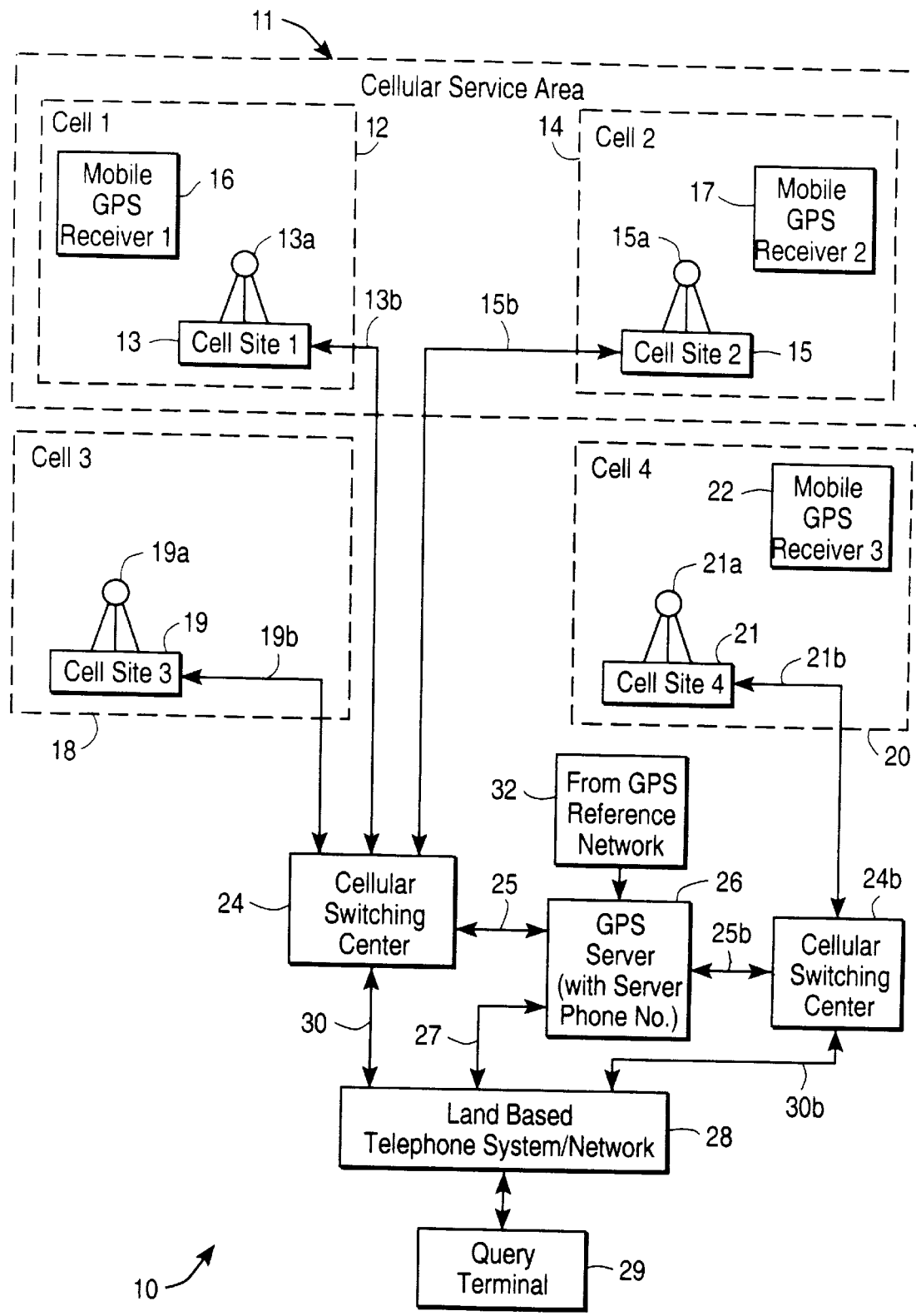
FIG. 4 shows an example of a wireless cell based communication system which may be used with the present invention.

FIG. 4 shows an example of a cell based communication system 10 which includes a plurality of cell sites, each of which is designed to service a particular geographical region or location. Examples of such cellular based or cell based communication systems are well known in the art, such as the cell based telephone systems. The cell based communication system 10 includes two cells 12 and 14, both of which are defined to be within a cellular service area 11. In addition, the system 10 includes cells 18 and 20. It will be appreciated that a plurality of other cells with corresponding cell sites and/or cellular service areas may also be included in the system 10 coupled to one or more cellular switching centers, such as the cellular switching center 24 and the cellular switching center 24b.

Figure 6:
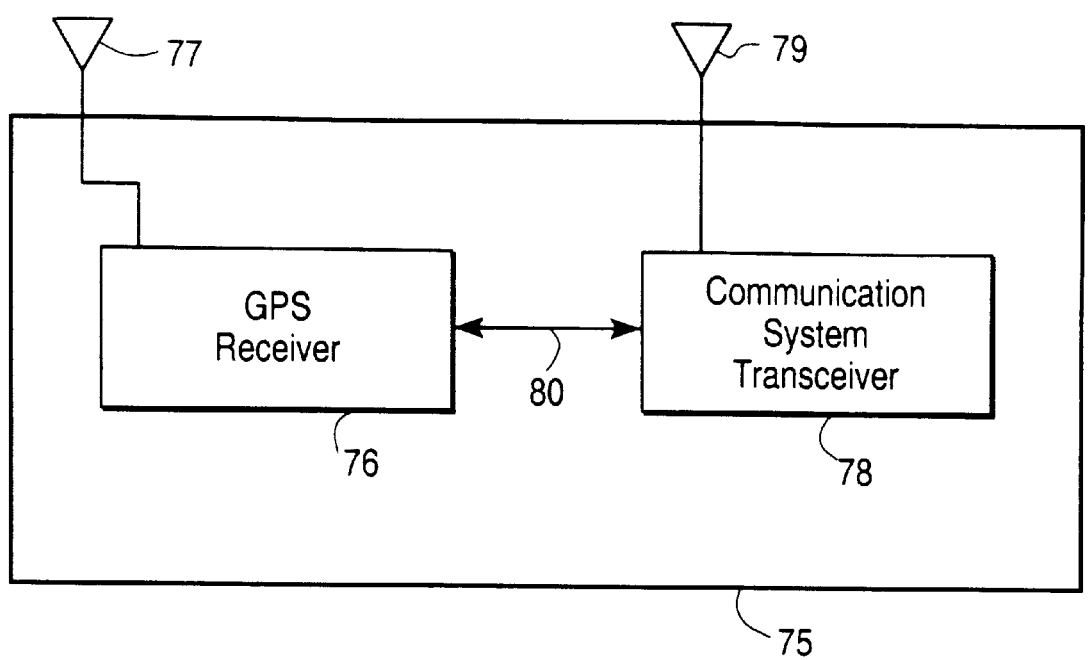
FIG. 6 shows an example of an SPS receiver which may be used with a location server.

Within each cell, such as the cell 12, there is a wireless cell site, or cellular site, such as cell site 13 which includes an antenna 13a which is designed to communicate through a wireless communication medium with a communication receiver which may be combined with a mobile GPS receiver such as the receiver 16 shown in FIG. 4. An example of such a combined system having a GPS receiver and a communication system is shown in FIG. 6 and may include both a GPS antenna 77 and a communication system antenna 79.

Each cell site is coupled to a cellular switching center. In FIG. 4, cell sites 13, 15, and 19 are coupled to switching center 24 through connections 13b, 15b and 19b respectively and cell site 21 is coupled to a different switching center 24b through connection 21b. These connections are typically wire line connections between the respective cell site and the cellular switching centers 24 and 24b. Each cell site includes an antenna for communicating with communication systems serviced by the cell site. In one example, the cell site may be a cellular telephone cell site which communicates with mobile cellular telephones in the area serviced by the cell site. It will be appreciated that a communication system within one cell, such as receiver 22 shown in cell 4, may in fact communicate with cell site 19 in cell 18 due to blockage (or other reasons why cell site 21 cannot communicate with the receiver 22).

In a typical embodiment of the present invention, the mobile GPS receiver 16 includes a cell based communication system which is integrated with the GPS receiver such that both the GPS receiver and the communication system are enclosed in the same housing. One example of this is a cellular telephone having an integrated GPS receiver which shares common circuitry with the cellular telephone transceiver. When this combined system is used for cellular telephone communications, transmissions occur between the receiver 16 and the cell site 13. Transmissions from the receiver 16 to the cell site 13 are then propagated over the connection 13b to the cellular switching center 24 and then to either another cellular telephone in a cell serviced by the cellular switching center 24 or through a connection 30 (typically wired) to another telephone through the land-based telephone system/network 28. It will be appreciated that the term wired includes fiber optic and other non wireless connections such as copper cabling, etc. Transmissions from the other telephone which is communicating with the receiver 16 are conveyed from the cellular switching center 24 through the connection 13b and the cell site 13 back to the receiver 16 in the conventional manner.

The remote data processing system 26 (which may be referred to in some embodiments as a GPS server or a location server) is included in the system 10 and is in one embodiment used to determine the position of a mobile GPS receiver (e.g. receiver 16) using GPS signals received by the GPS receiver. The GPS server 26 may be coupled to the land-based telephone system/network 28 through a connection 27, and it may also be optionally coupled to the cellular switching center 24 through the connection 25 and also optionally coupled to center 24b through the connection 25b. It will be appreciated that connections 25 and 27 are typically wired connections, although they may be wireless. Also shown as an optional component of the system 10 is a query terminal 29 which may consist of another computer system which is coupled through the network 28 to the GPS server 26. This query terminal 29 may send a request, for the position of a particular GPS receiver in one of the cells, to the GPS server 26 which then initiates a conversation with a particular communication system/GPS receiver through the cellular switching center in order to determine the position of the GPS receiver and report that position back to the query terminal 29. In another embodiment, a position determination for a GPS receiver may be initiated by a user of a mobile GPS receiver; for example, the user of the mobile GPS receiver may press 911 on the integrated cell phone to indicate an emergency situation at the location of the mobile GPS receiver and this may initiate a location process in the manner described herein.

It should be noted that a cellular based or cell based communication system is a communication system which has more than one transmitter, each of which serves a different geographical area, which is predefined at any instant in time. Typically, each transmitter is a wireless transmitter which serves a cell which has a geographical radius of less than 20 miles, although the area covered depends on the particular cellular system. There are numerous types of cellular communication systems, such as cellular telephones, PCS (personal communication system), SMR (specialized mobile radio), one-way and two-way pager systems, RAM, ARDIS, and wireless packet data systems. Typically, the predefined geographical areas are referred to as cells and a plurality of cells are grouped together into a cellular service area, such as the cellular service area 11 shown in FIG. 4, and these pluralities of cells are coupled to one or more cellular switching centers which provide connections to land-based telephone systems and/or networks. Service area are often used for billing purposes. Hence, it may be the case that cells in more than one service area are connected to one switching center. For example, in FIG. 4, cells 1 and 2 are in service area 11 and cell 3 is in service area 13, but all three are connected to switching center 24. Alternatively, it is sometimes the case that cells within one service area are connected to different switching centers, especially in dense population areas. In general, a service area is defined as a collection of cells within close geographical proximity to one another. Another class of cellular systems that fits the above description is satellite based, where the cellular basestations or cell sites are satellites that typically orbit the earth. In these systems, the cell sectors and service areas move as a function of time. Examples of such systems include Iridium, Globalstar, Orbcomm, and Odyssey.

Figure 5:
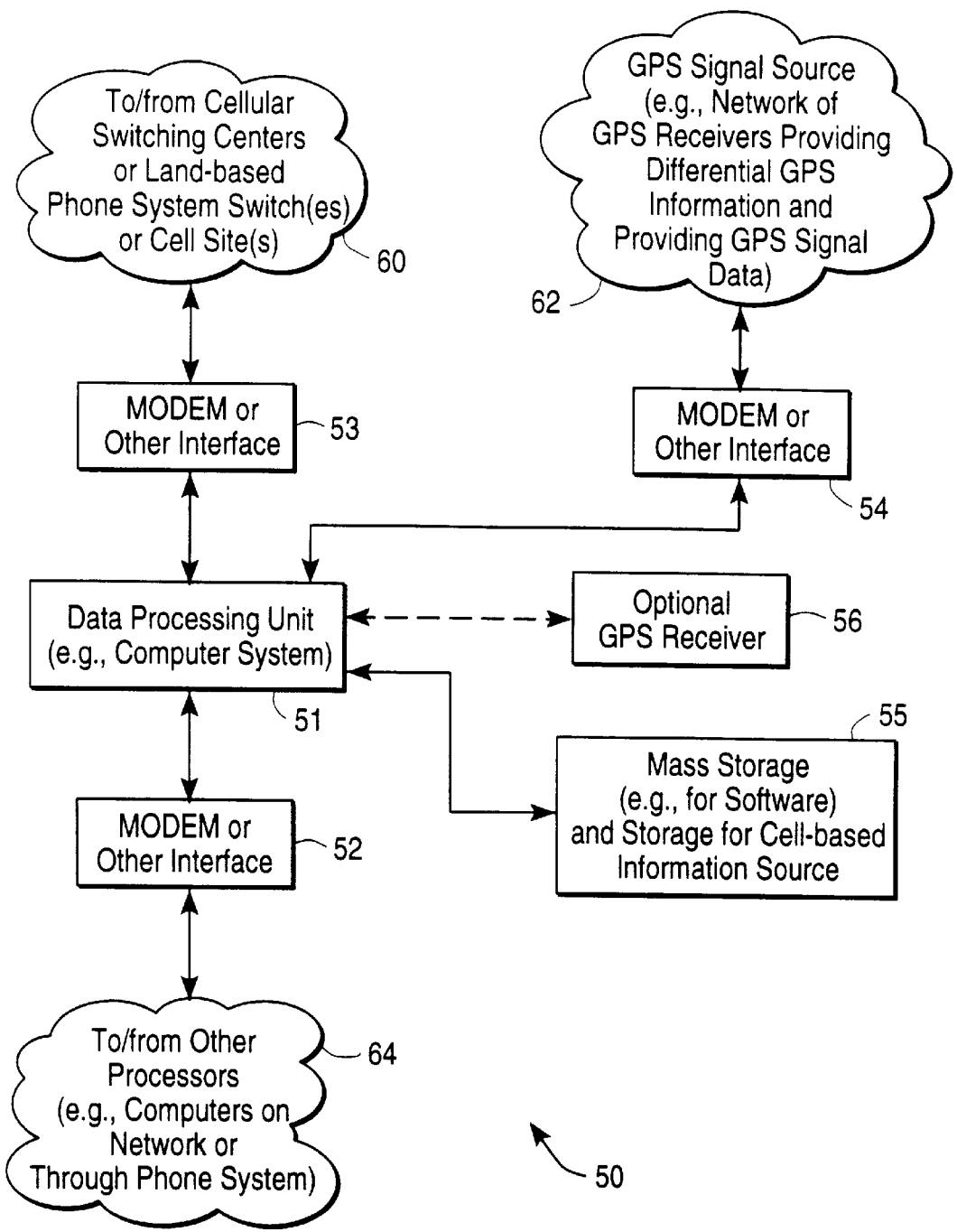
FIG. 5 shows an example of a location server which may be used to provide SPS assistance data to a mobile SPS receiver in accordance with one example of the present invention.

FIG. 5 shows an example of a GPS server 50 which may be used as the GPS server 26 in FIG. 4. The GPS server 50 of FIG. 5 includes a data processing unit 51 which may be a fault-tolerant digital computer system. The SPS server 50 also includes a modem or other communication interface 52 and a modem or other communication interface 53 and a modem or other communication interface 54. These communication interfaces provide connectivity for the exchange of information to and from the location server shown in FIG. 5 between three different networks, which are shown as networks 60, 62, and 64. The network 60 includes the cellular switching center or centers and/or the land-based phone system switches or the cell sites. Thus the network 60 may be considered to include the cellular switching centers 24 and 24b and the land-based telephone system/network 28 and the cellular service area 11 as well as cells 18 and 20. The network 64 may be considered to include the query terminal 29 of FIG. 4, an example of which is the Public Safety Answering Point (PSAP) which is typically the control center which answers 911 emergency telephone calls. In the case of the query terminal 29, this terminal may be used to query the server 26 in order to obtain a position information from a designated mobile SPS receiver located in the various cells of the cell based communication system. In this instance, the location operation is initiated by someone other than the user of the mobile GPS receiver. In the case of a 911 telephone call from the mobile GPS receiver which includes a cellular telephone, the location process is initiated by the user of the cellular telephone. The network 62, which represents the GPS reference network 32 of FIG. 4, is a network of GPS receivers which are GPS reference receivers designed to provide differential GPS correction information and also to provide GPS signal data which contains satellite ephemeris data to the data processing unit. When the server 50 serves a very large geographical area, a local optional GPS receiver, such as optional GPS receiver 56, may not be able to observe all GPS satellites that are in view of mobile SPS receivers throughout this area. Accordingly, the network 62 collects and provides satellite message data which contains satellite ephemeris data and provides differential GPS correction data over a wide area in accordance with the present invention.

As shown in FIG. 5, a mass storage device 55 is coupled to the data processing unit 51. Typically, the mass storage 55 will include storage for software for performing the GPS position calculations after receiving pseudoranges from the mobile GPS receivers, such as a receiver 16 of FIG. 4. These pseudoranges are normally received through the cell site and cellular switching center and the modem or other interface 53. The mass storage device 55 also includes software, at least in one embodiment, which is used to receive and use the satellite message data which contains satellite ephemeris data provided by the GPS reference network 32 through the modem or other interface 54. The mass storage device 55 also typically includes a database which stores cell object information, such as cell site identifiers, and corresponding approximate locations which are typically estimated locations for a mobile SPS receiver which is in radio communication with a particular cell site. This cell object information and corresponding locations is a cell based information source, an example of which is shown in FIG. 8 and is described further below.

In a typical embodiment of the present invention, the optional GPS receiver 56 is not necessary as the GPS reference network 32 of FIG. 4 (shown as network 62 of FIG. 5) provides the differential GPS information as well as providing the raw satellite data messages from the satellites in view of the various reference receivers in the GPS reference network. It will be appreciated that in server assisted modes (where the server provides assistance data to the mobile SPS receiver) the satellite message data obtained from the network through the modem or other interface 54 is normally used in a conventional manner with the pseudoranges obtained from the mobile GPS receiver in order to compute the position information for the mobile GPS receiver. The interfaces 52, 53, and 54 may each be a modem or other suitable communication interface for coupling the data processing unit to other computer systems in the case of network 64 and to cellular based communication systems in the case of network 60 and to transmitting devices, such as computer systems in the network 62. In one embodiment, it will be appreciated that the network 62 includes a dispersed collection of GPS reference receivers dispersed over a geographical region. The differential correction GPS information, obtained from a receiver near the cell site or cellular service area which is communicating with the mobile GPS receiver through the cellular based communication system, will provide differential GPS correction information which is appropriate for the approximate location of the mobile GPS receiver.

FIG. 6 shows a generalized combined system which includes a GPS receiver and a communication system transceiver. In one example, the communication system transceiver is a cellular telephone (sometimes also referred to as a cell telephone or PCS phone). The system 75 includes a GPS receiver 76 having a GPS antenna 77 and a communication transceiver 78 having a communication antenna 79. The GPS receiver 76 is coupled to the communication transceiver 78 through the connection 80 shown in FIG. 6. In one mode of operation according to an example of the invention, the communication system transceiver 78 receives approximate Doppler and estimated pseudoranges information through the antenna 79 and provides this approximate Doppler and estimated pseudoranges information over the link 80 to the GPS receiver 76 which performs the pseudorange determination by receiving the GPS signals from the GPS satellites through the GPS antenna 77. The determined pseudoranges are then transmitted to a location server, such as the GPS server shown in FIG. 4 through the communication system transceiver 78. Typically the communication system transceiver 78 sends a signal through the antenna 79 to a cell site which then transfers this information back to the GPS server, such as GPS server 26 of FIG. 4. Examples of various embodiments for the system 75 are known in the art. For example, U.S. Pat. No. 5,663,734 describes an example of a combined GPS receiver and communication system which utilizes an improved GPS receiver system. Another example of a combined GPS and communication system has been described in co-pending application Ser. No. 08/652,833, which was filed May 23, 1996. Various different architectures of GPS receivers may be used with the present invention; for example, the various examples of the invention may be used with conventional single or parallel channel correlator SPS receivers, SPS receivers which use digital signal processors with correlation algorithms (e.g. see U.S. Pat. No. 5,663,734), SPS receivers using matched filters (e.g. see co-pending U.S. patent application Ser. No. 09/021,854, filed Feb. 11, 1998, which application is hereby incorporated herein by reference), and SPS receivers using high parallel correlation systems such as those referred to above. The system 75 of FIG. 6, as well as numerous alternative communication systems having SPS receivers, may be employed with the methods of the present invention to operate with the GPS reference network of the present invention or with an SPS server which is not part of a network (e.g. a server at a cell site with a reference GPS receiver providing the server with time and satellite position information).

Figure 7:
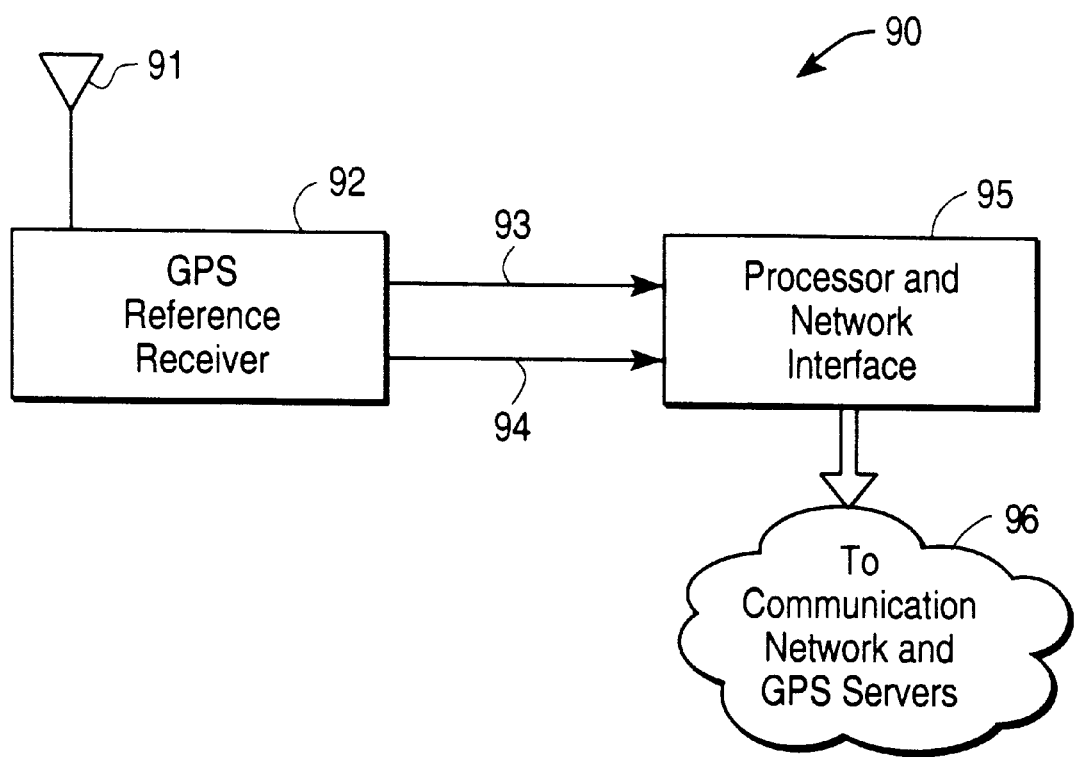
FIG. 7 shows an example of a reference GPS receiver which may be used with the location server shown in FIG. 4.

FIG. 7 shows one embodiment for a GPS reference station. It will be appreciated that each reference station may be constructed in this way and coupled to the communication network or medium. Typically, each GPS reference station, such as GPS reference station 90 of FIG. 7, will include a dual frequency GPS reference receiver 92 which is coupled to a GPS antenna 91 which receives GPS signals from GPS satellites in view of the antenna 91. GPS reference receivers are well known in the art. The GPS reference receiver 92, according to one embodiment of the present invention, provides at least two types of information as outputs from the receiver 92. Pseudorange outputs 93 are provided to a processor and network interface 95, and these pseudorange outputs are used to compute pseudorange corrections in the conventional manner for those satellites in view of the GPS antenna 91. The processor and network interface 95 may be a conventional digital computer system which has interfaces for receiving data from a GPS reference receiver as is well known in the art. The processor 95 will typically include software designed to process the pseudorange data to determine the appropriate pseudorange correction for each satellite in view of the GPS antenna 91. These pseudorange corrections are then transmitted through the network interface to the communication network or medium 96 to which other GPS reference stations are also coupled. The GPS reference receiver 92 also provides a satellite message data output 94. This data is provided to the processor and network interface 95 which then transmits this data onto the communication network 96.

The satellite message data output 94 is typically the raw 50 baud navigation binary data encoded in the actual GPS signals received from each GPS satellite. As such, the information content includes precision satellite position equations (called ephemeris equations), approximate satellite position information for all satellites, clock error models, time-of-day, and other information. This satellite message data is also referred to as a navigation message which is broadcast as the 50 bit per second data stream in the GPS signals from the GPS satellites and is described in great detail in the GPS ICD-200 document. The processor and network interface 95 receives this satellite message data output 94 and transmits it in real time or near real time to the communication network 96. This satellite message data is transmitted into the communication network and is received through the network at various location servers according to aspects of the present invention.

In certain embodiments of the present invention, only certain segments of the satellite message data may be sent to location servers in order to lower the bandwidth requirements for the network interfaces and for the communication network. Also, this data may not need to be provided continuously. For example, only the first three frames which contain ephemeris equations rather than all 5 frames together may be transmitted into the communication network 96. It will be appreciated that in one embodiment of the present invention, the location server may use the satellite message data transmitted from one or more GPS reference receivers in order to perform a method for measuring time related to satellite data messages, such as the method described in co-pending U.S. patent application Ser. No. 08/794,649, which was filed Feb. 3, 1997, by Norman F. Krasner. It will be also understood that the GPS reference receiver 92 decoded the different GPS signals from the different GPS satellites in view of the reference receiver 92 in order to provide the binary data output 94 which contains satellite ephemeris data.

FIG. 8 shows an example of a cell based information source which in one embodiment may be maintained at a data processing station such as the GPS server 26 shown in FIG. 4. Alternatively, this information source may be maintained at a cellular switching center such as the cellular switching center 24 of FIG. 4 or at each cell site, such as cell site 13 shown in FIG. 4. Typically, however, this information is maintained and routinely updated at the location server which is coupled to the cellular switching center. The information source may maintain the data in various formats, and it will be appreciated that the format shown in FIG. 8 illustrates only one example of a format. Typically, each estimated location, such as estimated location 212*a*, will include a corresponding cell object such as a cell site location or identification for a cell site or service area, such as cell site identifier 208*a*. The information in the cell based information source 201 may be maintained in a database which includes cell object information, such as an identification of cell service areas or cell sites shown in columns 208 and 210 respectively and also include corresponding estimated locations such as the information shown in column 212. It will be appreciated that each estimated location may be an average location of the geographical region covered by the radio signal coverage from a cell site. Other mathematical representations of the estimated location around the cell site may be used. It may be useful to use an estimated location near the cell site (such as estimated location 212*a*) rather than the location of the cell site particularly where the cell site's position may not be representative of the locations at which mobile SPS receivers can be found in the particular area in radio coverage of the cell site.

The use of the cell based information source 201 will now be described in conjunction with FIG. 9 which shows an example of a method of the present invention. In this following description, it will be assumed that the mobile SPS receiver will receive SPS signals and determine pseudoranges from those signals but will not complete a position solution calculation at the mobile receiver. Rather, the mobile receiver will transmit these pseudoranges to a particular cell site with which it is in radio communication and this cell site will forward the pseudoranges to a mobile switching center which will in turn forward the pseudoranges to a location server, such as the GPS server 26 of FIG. 4.

Figure 9:
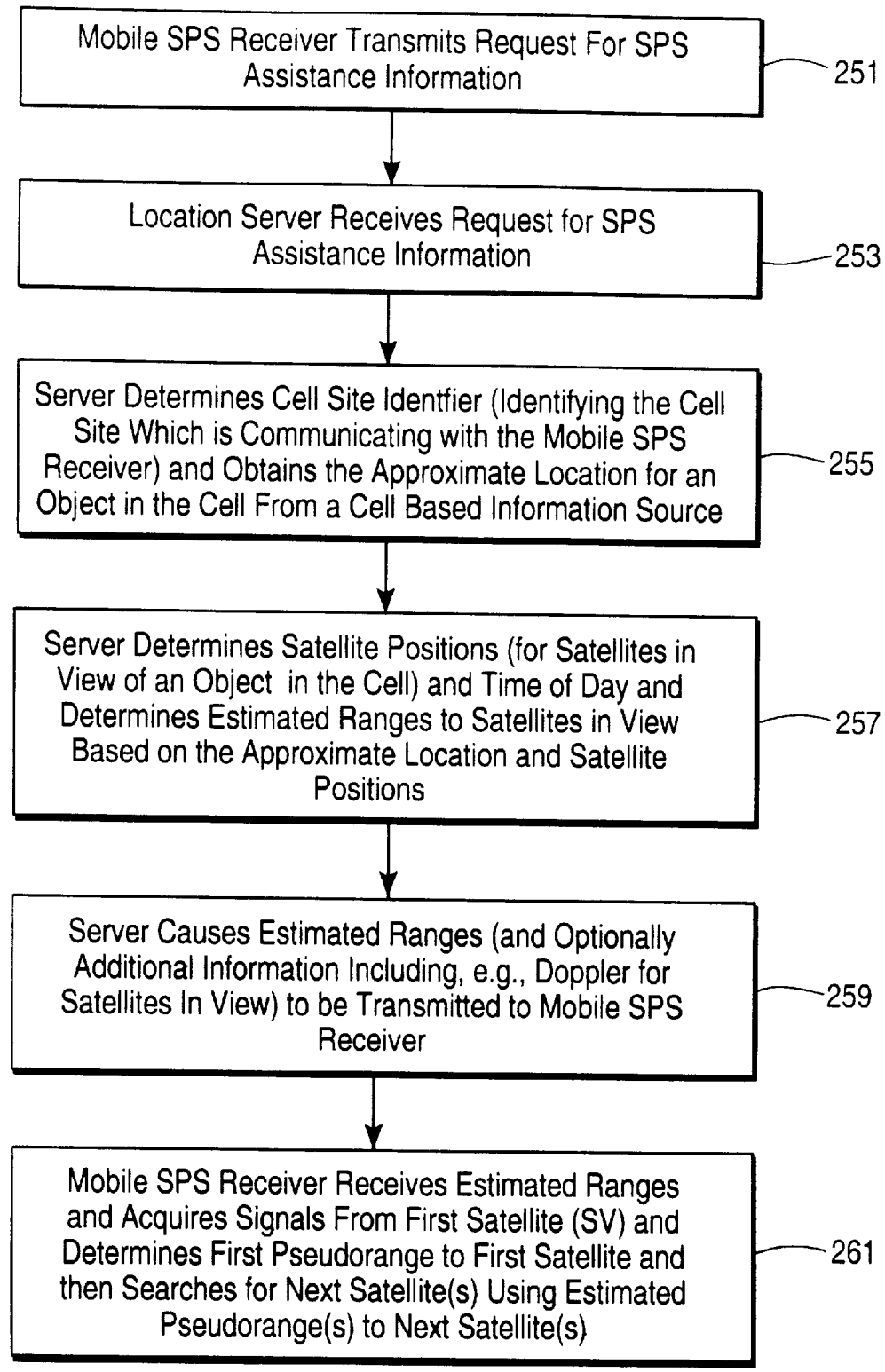
FIG. 9 is a flowchart depicting another method according to the present invention in which a location server provides SPS assistance information according to one example of the present invention.

The method of FIG. 9 begins in step 251 in which a mobile SPS receiver transmits a request for SPS assistance information. Typically, this will occur when the position of the receiver is desired. This may be at the request of the user of the SPS receiver (e.g. a "911" call from the user) or at the request of another user remotely located from the SPS receiver in order to track the SPS receiver. This assistance information request is forwarded through the cell based communication system to the location server which receives, in step 253, the request for SPS assistance information. In step 255, the location server determines the cell site identifier which identifies the cell site which is communicating with the communication system of the mobile SPS receiver. The location server obtains the approximate location for an object in the cell serviced by the cell site from a cell based information source. This may occur by the location server receiving a cell site identifier or a location for the cell site which is in wireless communication with a mobile cell based communication system which is coupled to the mobile SPS receiver, such as the receiver shown in FIG. 6. For example, the cell site may forward its identifier information or may forward its location with the SPS assistance information request from the mobile SPS receiver to the location server. Using either the cell site identifier or the location of the cell site, the location server performs a lookup operation in the cell based information source to obtain the approximate location for an object in the cell serviced by the cell site. In step 257, the location server then determines the satellite positions for satellites in view of an object in the cell. The location server will typically also determine the time of day and determine, from the satellite position information and the time of day, estimated ranges to satellites in view of an object in the cell. For example, time of day information may be obtained from an SPS receiver that is locally connected to the location server or from a remote SPS receiver whose time of day information is communicated to the location server via a communications link (e.g. a long distance link or wide area network). These estimated ranges are based upon the approximate location determined for an object in the cell; the approximate location is taken to be the approximate location of the mobile SPS receiver. These estimated ranges are also based upon the satellite positions determined for the satellites in view at the time of day determined by the location server. In step 259, the server causes the estimated ranges and, optionally, additional information including, for example, Doppler for satellites in view, to be transmitted to the mobile SPS receiver. In step 261, the mobile SPS receiver receives estimated ranges and acquires signals from a first satellite and determines a first pseudorange to the first satellite and then searches for the next satellites using the estimated pseudoranges to the next satellites. In this manner, the mobile SPS receiver can shorten the search time which is required to acquire SPS signals from the various satellites in view by searching in ranges determined by the estimated pseudoranges to each appropriate satellite. It will be appreciated that the estimated pseudoranges may include an estimated pseudorange for the first satellite and that this estimated pseudorange may or may not be used in searching for the first satellite's signals depending upon its accuracy. Often, the first satellite which is acquired has the highest signal-to-noise ratio relative to the other satellites in view.

It will be appreciated that in other examples of the invention, the mobile SPS receiver may determine pseudoranges for satellites in-view and determine its position (e.g. latitude and longitude) by obtaining satellite ephemeris data and calculating its position from the determined pseudoranges and the satellite ephemeris data; in this case, a server may provide to the mobile receiver the satellite ephemeris data of satellites in view of the server in a region, such as a cell, but not perform a final position calculation.

In yet other examples of the present invention, a location server may be dedicated to and located at a cell site with a GPS reference receiver. In this case, each cell site may have its own location server and GPS reference receiver which provides time of day and satellite ephemeris data to the location server which in turn can use this data in accordance with the present invention to provide estimated pseudoranges or estimated satellite ranges to the mobile SPS receiver, or to provide time of day, approximate location, and satellite position data to the mobile SPS receiver so that it can determine estimated ranges in order to reduce the search time to acquire SPS signals. With a GPS reference receiver at the cell site, there is typically no need to receive data from a network of GPS reference receivers as the local GPS reference receiver can determine differential corrections and satellite ephemeris data and time of day from satellites in-view of the receiver, and the location of the cell site (or some approximate proxy) may be used as the approximate location of the mobile SPS receiver which is in communication with the cell site. This local server may merely transmit aiding information (e.g. satellite ephemeris and/or time of day) to the mobile SPS receiver and let the mobile SPS receiver determine estimated pseudoranges or ranges to reduce the search time to acquire SPS signals or may determine these estimated pseudoranges or estimated ranges and transmit them to the mobile SPS receiver. The mobile SPS receiver may then determine precision pseudoranges and compute its position (from the determined pseudoranges and satellite ephemeris data it received from SPS satellites or from the location server) or determine precision pseudoranges and transmit these determined pseudoranges to the location server which computes the position of the mobile SPS receiver.

The foregoing is one example of the present invention, and there are various alternatives which are within the scope of the invention. For example, the mobile SPS receiver could perform all operations itself without assistance from a remote server. The mobile SPS receiver may be able to determine its approximate location from a cell site identifier which is transmitted to the mobile SPS receiver. Using the cell site identifier, the mobile SPS receiver may perform a lookup operation in a database maintained in the mobile SPS receiver to determine an approximate location and also may obtain almanac information (e.g. from storage in the receiver from prior SPS signal reception) or other satellite position information and may obtain time of day information (e.g. from a cellular transmission as described above). From the satellite position information, time of day, and from the approximate location, the mobile SPS receiver may determine estimated pseudoranges for various satellites in order to shorten the time required to search for and acquire SPS signals to satellites in view. The SPS receiver may then complete the position calculation by using the pseudoranges and satellite ephemeris data, although, alternatively, the SPS receiver may also transmit the determined pseudoranges to a location server which then completes the position calculation.

In another alternative example of the invention, the server may perform assistance operation by providing approximate location and/or satellite ephemeris data to the mobile SPS receiver which in turn determines its own estimated pseudoranges. In yet another alternative, the server assists the mobile SPS receiver by providing satellite ephemeris information, and the mobile unit determines time and its approximate location from transmissions between the mobile SPS unit and a cell site and then the mobile SPS unit determines estimated pseudoranges.

The main variations on search reduction are provided in the table of FIG. 10. The table discriminates along its rows 302 and 304 the accuracy of time of day that may be established at the SPS receiver. The table discriminates along columns 308, 310 and 312, the nature of the aiding position information that is gotten by the SPS receiver. The entries to the table, 322, 324, 326, 330, 332, and 334 show whether or not the first processed satellite signal's search range may be reduced. In initial search, an unaided SPS receiver searches over the PN frame, which for the U.S. GPS system (C/A code) is a 1 millisecond period. Hence, if time of day available to the SPS receiver is no better than 1 millisecond, it must search the entire 1 millisecond range for the PN epoch. However, once the first satellite's signal is acquired, the search for the other signals may be done at times relative to the PN epoch found from the first signal's search procedure (i.e. the determination of the first signal's pseudorange). This was discussed previously. If more precision time of day is available at the SPS receiver, then the search range of the first satellite's signal may be reduced. In all cases the search reduction requires approximate knowledge of the satellites' ranges to the SPS (expressed in either distance or equivalent time units, using the speed of light).

Range information may be provided by three primary methods (314, 316, and 318): (1) providing satellite ephemeris data, (2) providing satellite almanac data and (3) providing satellite range data. Here satellite ephemeris data means a precision mathematical description of the satellites' positions versus time, that is valid for a relatively short period of time, typically less than two hours. Satellite almanac data is a mathematical description of the satellites' positions versus time, that is valid for a relatively long period of time, typically one month. By its nature, then the accuracy of satellites' positions is much poorer with almanac data (typically several kilometer error) relative to ephemeris data (several meters error) and it degrades with time, until the equations are updated. Both ephemeris data and almanac data are transmitted by GPS satellites. The form of this data is typically coefficients associated with Kepler equations. However, alternative descriptions are possible (e.g. spherical harmonic descriptions, etc.) and are consistent with this invention. For example, when almanac or ephemeris data are supplied to the SPS receiver from a remote location server, they may take any of a number of forms, that may allow reduced computation in the SPS receiver or reduced storage, for example. If almanac or ephemeris data are available to the SPS receiver, then the SPS receiver must know its approximate location so that the (approximate) satellite ranges may be computed at a given time. If accurate time is available, then the range and time can be used to estimate the PN frame epochs and reduce search time even for the first satellite's signal to be processed. If only approximate time (greater than 1 millisecond) is available, then the signals subsequent to the first signal acquired can be searched by computing an estimated difference in ranges to the first and subsequent satellites. Then each of the PN frame epochs of the subsequent satellites can be searched in a range that is offset from the PN frame epoch found for the first (or other processed) signal by an amount equal to the estimate range difference (expressed in time units). The third method provides directly the estimated satellite range equations to the SPS receiver. These equations, for example polynomial equations in time or distance, may be provided to the SPS receiver by a remote server which is located close to the SPS receiver or which knows approximately the location of the SPS receiver, and provides appropriate equations for its location. In this case the SPS receiver does not need to know its location since the equations provide the ranges of times to search for each satellite. In effect 326 simply is a direct specification of the ranges of times to search and 334 is a specification of the ranges of times to search relative to the received time of a given satellite signal.

An advantage of using almanac data is that it is valid for very long periods of time and hence does not require transmission from a server very often, or never if the almanac is occasionally read from the SPS satellites' transmissions. An advantage of ephemeris data is that it is more precise and hence reduces search range to a greater degree than does almanac data. In addition, ephemeris data transmitted from a server may be used to compute at the SPS receiver its location, without having to read this data from the SPS satellites (which is time consuming and difficult for weak received signal levels). Satellite range equations may be used in substitution for either almanac or ephemeris data but typically is accurate over relatively short periods of time, or may not be as compact in size as the other mathematical descriptions if it is to be valid over long periods of time. Hence each of the approaches to providing position information has its benefits and disadvantages that maybe traded off in different applications.

Although the methods and apparatus of the present invention have been described with reference to GPS satellites, it will be appreciated that the teachings are equally applicable to positioning systems which utilize pseudolites or a combination of satellites and pseudolites. Pseudolites are ground based transmitters which broadcast a PN code (similar to a GPS signal) modulated on an L-band carrier signal, generally synchronized with GPS time. Each transmitter may be assigned a unique PN code so as to permit identification by a remote receiver. Pseudolites are useful in situations where GPS signals from an orbiting satellite might be unavailable, such as tunnels, mines, buildings or other enclosed areas. The term "satellite", as used herein, is intended to include pseudolite or equivalents of pseudolites, and the term GPS signals, as used herein, is intended to include GPS-like signals from pseudolites or equivalents of pseudolites.

In the preceding discussion the invention has been described with reference to application upon the United States Global Positioning Satellite (GPS) system. It should evident, however, that these methods are equally applicable to similar satellite positioning systems, and in, particular, the Russian Glonass system. The Glonass system primarily differs from GPS system in that the emissions from different satellites are differentiated from one another by utilizing slightly different carrier frequencies, rather than utilizing different pseudorandom codes. The term "GPS" used herein includes such alternative satellite positioning systems, including the Russian Glonass system.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method for reducing search time to acquire satellite positioning system (SPS) signals in a satellite positioning system (SPS) receiver, said method comprising:

determining a first pseudorange to a first SPS satellite;

determining an approximate location of said SPS receiver;

determining an estimated pseudorange for a second pseudorange to a second SPS satellite, said estimated pseudorange being determined from said approximate location and said first pseudorange;

searching for time of arrival of SPS signals from said second SPS satellite in a range determined by said estimated pseudorange.

2. A method as in claim 1 further comprising:

determining a time information;

determining a satellite position of said second satellite, wherein said estimated pseudorange is determined from said approximate location and said satellite position.

3. A method as in claim 2 wherein said search time is to initially acquire said SPS signals and wherein said estimated pseudorange is not based on a previously determined pseudorange for said second SPS satellite and wherein said searching is over time intervals determined by said estimated pseudorange and wherein said time information is an approximate time of day which is accurate to within ±10 minutes, and wherein said estimated pseudorange is one of an estimated time of arrival of SPS signals from said SPS satellite or an estimated distance to said SPS satellite from said SPS receiver.

4. A method as in claim 2 wherein said range is based on an error associated with at least one of said approximate location and said time information and said satellite position.

5. A method as in claim 2 wherein said range is determined relative to said first pseudorange and a reference time of said SPS receiver.

6. A method as in claim 2 wherein said approximate location is obtained from a cell based information source.

7. A method as in claim 6 wherein said approximate location is received at said SPS receiver from said cell based information source.

8. A method as in claim 6 wherein said cell based information source is coupled to a location server and wherein said approximate location represents a location of a cell object in a cell based communication system.

9. A method as in claim 2 further comprising:

receiving a precision carrier frequency signal from a source providing said precision carrier frequency signal;

automatically locking to said precision carrier frequency signal and providing a reference signal;

using said reference signal to provide a local oscillator signal to acquire SPS signals.

10. A method as in claim 8 wherein said location server determines said approximate location from said cell based information source by determining an identification of a wireless cell site which is in wireless communication with a wireless communication system which is coupled to said SPS receiver.

11. A method as in claim 10 wherein said location server determines said estimated pseudorange.

12. A method as in claim 2 further comprising:

determining another estimated pseudorange for a third pseudorange to a third SPS satellite;

determining another satellite position of said third SPS satellite, wherein said another estimated pseudorange is determined from said approximate location and said another satellite position.

13. A method as in claim 12 further comprising searching for SPS signals from said third SPS satellite in a range determined by said another estimated pseudorange.

14. A method for initially acquiring satellite positioning system (SPS) signals in a SPS receiver, said method comprising:

determining a first pseudorange to a first SPS satellite;

determining an approximate location of said SPS receiver;

determining an estimated pseudorange for a second pseudorange to a second SPS satellite, said estimated pseudorange being determined from said approximate location and said first pseudorange;

searching for time of arrival of SPS signals from said second SPS satellite in a range determined by said estimated pseudorange.

15. A method as in claim 14 further comprising:

determining a time information;

determining a satellite position of said second satellite, wherein said estimated pseudorange is determined from said approximate location and said satellite position.

16. A method as in claim 15 wherein said search time is to initially acquire said SPS signals and wherein said estimated pseudorange is not based on a previously determined pseudorange for said second SPS satellite.

17. A method as in claim 15 wherein said range is determined relative to said first pseudorange and a reference time of said SPS receiver.

18. A method as in claim 15 wherein said approximate location is obtained from a cell based information source.

19. A method as in claim 18 wherein said approximate location is received at said SPS receiver from said cell based information source.

20. A method as in claim 18 wherein said cell based information source is coupled to a location server and wherein said approximate location represents a location of a cell object in a cell based communication system.

21. A method as in claim 20 further comprising:
receiving a precision carrier frequency signal from a source providing said precision carrier frequency signal;
automatically locking to said precision carrier frequency signal and providing a reference signal;
using said reference signal to provide a local oscillator signal to acquire SPS signals.

22. A method as in claim 20 wherein said location server determines said approximate location from said cell based information source by determining an identification of a wireless cell site which is in wireless communication with a wireless communication system which is coupled to said SPS receiver.

23. A satellite positioning system (SPS) receiver comprising:
an SPS antenna which is configured to receive SPS signals;
a processor coupled to said SPS antenna, said processor determining a first pseudorange to a first SPS satellite and searching for time of arrival of SPS signals from a second SPS satellite in a range determined by an estimated pseudorange to said second SPS satellite, said estimated pseudorange being determined from an approximate location of said SPS receiver and from said first pseudorange.

24. An SPS receiver as in claim 23 further comprising a communication system which is coupled to said processor, wherein said communication system provides said approximate location to said processor.

25. An SPS receiver as in claim 23 further comprising a cell based communication system which is coupled to said processor, wherein said cell based communication system receives said estimated pseudorange and provides said estimated pseudorange to said processor.

26. An SPS receiver as in claim 25 wherein estimated pseudorange is determined from said approximate location and a satellite position of said second SPS satellite.

27. An SPS receiver as in claim 25 wherein said estimated pseudorange is not based on a previously determined pseudorange for said second SPS satellite.

28. An SPS receiver as in claim 25 wherein said range is determined relative to said first pseudorange and a reference time of said SPS receiver.

29. An SPS receiver as in claim 28 wherein said processor searches for SPS signals from a third SPS satellite in a range determined by another estimated pseudorange to a third SPS satellite, said another estimated pseudorange being determined from said approximate location of said SPS receiver.

30. A digital processing system comprising:
a communication interface;
a storage device;
a processor coupled to said storage device and to said communication interface, said processor determining an approximate location of a mobile satellite positioning system (SPS) receiver which is capable of communication with said digital processing system through said communication interface and wherein said processor determines an estimated pseudorange for a first pseudorange to a first SPS satellite, said estimated pseudorange being determined from said approximate location and a satellite position of said first SPS satellite and wherein said estimated pseudorange is transmitted through said communication interface to said mobile SPS receiver.

31. A digital processing system as in claim 30 wherein said approximate location is obtained from a cell based information source which is stored in said storage device.

32. A digital processing system as in claim 31 wherein said cell based information source provides approximate location information for objects in a cell of a wireless cell based communication system.

33. A digital processing system as in claim 31 wherein said approximate location represents a location of a cell object in a wireless cell based communication system.

34. A digital processing system as in claim 33 wherein said cell object is a wireless cell site in said wireless cell based communication system.

35. A digital processing system as in claim 33 wherein said approximate location is determined from said cell based information source by determining an identification of a wireless cell site which is in wireless communication with a wireless communication system which is coupled to said mobile SPS receiver.

36. A computer readable medium containing executable computer program instructions which, when executed by a data processing system, cause said data processing system to perform a method comprising:
determining an approximate location of a mobile satellite positioning system (SPS) receiver;
determining an estimated pseudorange for a first pseudorange to a first SPS satellite, said estimated pseudorange being determined from said approximate location and a satellite position of said first SPS satellite;
transmitting said estimated pseudorange to said mobile SPS receiver.

37. A computer readable medium as in claim 36 wherein said method further comprises:
determining another estimated pseudorange for a second pseudorange to a second SPS satellite, said another estimated pseudorange being determined from said approximate location and another satellite position of said second SPS satellite, and wherein said approximate location is determined from said cell based information source by determining an identification of a wireless cell site which is in wireless communication with a wireless communication system which is coupled to said mobile SPS receiver.

38. A method as in claim 2 wherein said time information is an approximate time of day at said SPS receiver which has an accuracy of better than 10 minutes and wherein said satellite position is determined from an external source which transmits a set of ephemeris data corresponding to a set of SPS satellites viewable by said SPS receiver.

39. A method as in claim 2 wherein said SPS receiver determines said time information from a communication signal in a cell based communication system.

40. A method as in claim 2 wherein said SPS receiver uses a matched filter to acquire SPS signals.

41. A method as in claim 2 wherein said satellite position comprises at least one of (a) a set of ephemeris data corresponding to a set of SPS satellites viewable by said SPS receiver; or (b) a set of Almanac data corresponding to said set of SPS satellites viewable by said SPS receiver.

42. A method as in claim 41 wherein said set of ephemeris data is obtained from a reference network of SPS receivers.

43. A method as in claim 41 wherein said set of Almanac data is obtained from a reference network of SPS receivers.

44. A method as in claim 41 wherein said set of ephemeris data is obtained from an SPS reference receiver at a cell site which is in communication with said SPS receiver.

45. A method as in claim 41 wherein said set of Almanac data is obtained from an SPS reference receiver at a cell site which is in communication with said SPS receiver.

46. A method as in claim 41 wherein said set of Almanac data is obtained by said SPS receiver from SPS signals from SPS satellites.

47. A method as in claim 39 wherein said cell based communication system is a CDMA (code division multiple access) system.

48. A method as in claim 39 wherein said step of determining said time of day is performed by reading a time of day message present with a cellular communication signal received by said SPS receiver over a cell based communications link.

49. A method for reducing search time to acquire satellite positioning system (SPS) signals in a satellite positioning system (SPS) receiver, said method comprising:

determining a time of day at said SPS receiver to an accuracy of better than a framing period of said SPS signals;

determining an approximate location of said SPS receiver;

determining an estimated pseudorange for at least one SPS satellite, said estimated pseudorange being determined from said approximate location and from a satellite position data and from said time of day;

searching for time of arrival of SPS signals from said SPS satellite in a range determined by said estimated pseudorange.

50. A method as in claim 49 wherein said satellite position data is received from an external source.

51. A method as in claim 50 wherein said search time is to initially acquire said SPS signals and wherein said estimated pseudorange is not based on a previously determined pseudorange for said SPS satellite and wherein said satellite position data comprises a set of Almanac data corresponding to a set of SPS satellites viewable by said SPS receiver.

52. A method as in claim 50 wherein said range is based on an error associated with at least one of said approximate location and said time of day and said satellite position data.

53. A method as in claim 50 wherein said satellite position data comprises a set of ephemeris data corresponding to a set of SPS satellites viewable by said SPS receiver.

54. A method as in claim 50 wherein said approximate location is obtained from a cell based information source and wherein said external source is at least one of (a) SPS satellites or (b) a cell based communication system.

55. A method as in claim 54 wherein said approximate location is received at said SPS receiver from said cell based information source.

56. A method as in claim 54 wherein said cell based information source is coupled to a location server and wherein said approximate location represents a location of a cell object in a cell based communication system.

57. A method as in claim 56 further comprising:

receiving a precision carrier frequency signal from a source providing said precision carrier frequency signal;

automatically locking to said precision carrier frequency signal and providing a reference signal;

using said reference signal to provide a local oscillator signal to acquire SPS signals.

58. A method as in claim 56 wherein said location server determines said approximate location from said cell based information source by determining an identification of a wireless cell site which is in wireless communication with a wireless communication system which is coupled to said SPS receiver.

59. A method as in claim 58 wherein said location server determines said estimated pseudorange.

60. A method as in claim 50 further comprising:

determining another estimated pseudorange for another pseudorange to another SPS satellite;

determining another satellite position of said another SPS satellite, wherein said another estimated pseudorange is determined from said approximate location and said another satellite position.

61. A method as in claim 60 further comprising searching for time of arrival of SPS signals from said another SPS satellite in a range determined by said another estimated pseudorange.

62. A method for initially acquiring satellite positioning system (SPS) signals in a SPS receiver, said method comprising:

determining a time of day at said SPS receiver to an accuracy of better than a framing period of said SPS signals;

determining an approximate location of said SPS receiver;

determining an estimated pseudorange for at least one SPS satellite, said estimated pseudorange being determined from said approximate location and from a satellite position data and from said time of day;

searching for time of arrival of SPS signals from said SPS satellite in a range determined by said estimated pseudorange.

63. A method as in claim 62 wherein said satellite position data is received from an external source.

64. A method as in claim 63 wherein said search time is to initially acquire said SPS signals and wherein said estimated pseudorange is not based on a previously determined pseudorange for said SPS satellite and wherein said satellite position data comprises a set of Almanac data corresponding to a set of SPS satellites viewable by said SPS receiver.

65. A method as in claim 63 wherein said satellite position data comprises a set of ephemeris data corresponding to a set of SPS satellites viewable by said SPS receiver.

66. A method as in claim 63 wherein said approximate location is obtained from a cell based information source.

67. A method as in claim 66 wherein said approximate location is received at said SPS receiver from said cell based information source.

68. A method as in claim 66 wherein said cell based information source is coupled to a location server and wherein said approximate location represents a location of a cell object in a cell based communication system.

69. A method as in claim 68 further comprising:

receiving a precision carrier frequency signal from a source providing said precision carrier frequency signal;

automatically locking to said precision carrier frequency signal and providing a reference signal;

using said reference signal to provide a local oscillator signal to acquire SPS signals.

70. A method as in claim 68 wherein said location server determines said approximate location from said cell based information source by determining an identification of a wireless cell site which is in wireless communication with a wireless communication system which is coupled to said SPS receiver.

71. A satellite positioning system (SPS) receiver comprising:
an SPS antenna which is configured to receive SPS signals;
a processor coupled to said SPS antenna, said processor determining a time of day at said SPS receiver to an accuracy of better than a framing period of said SPS signals and searching for a time of arrival of SPS signals from an SPS satellite in a range determined by an estimated pseudorange to said SPS satellite, said estimated pseudorange being determined from an approximate location of said SPS receiver and from a satellite position data and from said time of day.

72. An SPS receiver as in claim 71 further comprising a communication system which is coupled to said processor, wherein said communication system provides said approximate location to said processor.

73. An SPS receiver as in claim 71 further comprising a cell based communication system which is coupled to said processor, wherein said cell based communication system receives said estimated pseudorange and provides said estimated pseudorange to said processor.

74. An SPS receiver as in claim 73 wherein estimated pseudorange is determined from said approximate location and a satellite position of said SPS satellite.

75. An SPS receiver as in claim 73 wherein said estimated pseudorange is not based on a previously determined pseudorange for said SPS satellite.

76. An SPS receiver as in claim 72 wherein said satellite position data is received from an external source being one of (a) an SPS satellite or (b) a cell based communication system, and wherein said time of day is determined from a communication signal in a cell based communication system.

77. An SPS receiver as in claim 76 wherein said processor searches for a time of arrival of SPS signals from another SPS satellite in a range determined by another estimated pseudorange to said another SPS satellite, said another estimated pseudorange being determined from said approximate location of said SPS receiver.

78. A method as in claim 49 wherein said SPS receiver uses a matched filter to acquire SPS signals.

79. A method as in claim 49 wherein said SPS receiver determines said time of day from a communication signal in a cell based communication system.

80. A method as in claim 79 wherein said cell based communication system comprises a CDMA (code division multiple access) system.

81. A method as in claim 79 wherein said communication signal is one of a time of day message or a series of timed pulses.

82. A method as in claim 51 wherein said set of Almanac data is obtained from at least one of (a) a reference network of SPS receivers; (b) an SPS reference receiver at a cell site which is in communication with said SPS receiver; or (c) from SPS signals from SPS satellites received by said SPS receiver.

83. A method as in claim 53 wherein said set of ephemeris data is obtained from at least one of (a) a reference network of SPS receivers; (b) an SPS reference receiver at a cell site which is in communication with said SPS receiver or (c) from SPS signals from SPS satellites received by said SPS receiver.

84. A method for reducing search time to acquire satellite positioning system (SPS) signals in a satellite positioning system (SPS) receiver, said method comprising:
determining a time of day at said SPS receiver;
obtaining a set of mathematical descriptions of estimated ranges versus time, said estimated ranges being from said SPS receiver to said SPS satellites viewable by said SPS receiver;
determining an estimated pseudorange for at least one SPS satellite, said estimated pseudorange being determined from said time of day and from said set of mathematical descriptions;
searching for time of arrival of SPS signals from said SPS satellite in a range determined by said estimated pseudorange.

85. A method as in claim 84 wherein said set of mathematical descriptions is received from an external source.

86. A method as in claim 85 wherein said search time is to initially acquire said SPS signals and wherein said estimated pseudorange is one of an estimated time of arrival of SPS signals from said SPS satellite or an estimated distance to said SPS satellite from said SPS receiver, and wherein said searching is over time intervals determined by said estimated pseudorange.

87. A method as in claim 85 wherein said range is based on an error associated with at least one of said time of day and said set of mathematical descriptions.

88. A method as in claim 85 further comprising determining a first pseudorange to a first SPS satellite and wherein said estimated pseudorange is determined also from said first pseudorange, and wherein said time of day is approximate.

89. A method as in claim 85 wherein said set of mathematical descriptions uses an approximate location of said SPS receiver obtained from a cell based information source.

90. A method as in claim 89 wherein said approximate location is received at said SPS receiver from said cell based information source.

91. A method as in claim 89 wherein said cell based information source is coupled to a location server and wherein said approximate location represents a location of a cell object in a cell based communication system.

92. A method as in claim 91 wherein said cell object is a wireless cell site in said cell based communication system.

93. A method as in claim 91 wherein said location server determines said approximate location from said cell based information source by determining an identification of a wireless cell site which is in wireless communication with a wireless communication system which is coupled to said SPS receiver.

94. A method as in claim 93 wherein said location server determines said set of mathematical descriptions and causes said set of mathematical descriptions to be transmitted to said SPS receiver.

95. A method as in claim 85 further comprising:
receiving a precision carrier frequency signal from a source providing said precision carrier frequency signal;
automatically locking to said precision carrier frequency signal and providing a reference signal;
using said reference signal to provide a local oscillator signal to acquire SPS signals.

96. A method as in claim 85 wherein said time of day is accurate to within a framing period of said SPS signals.

97. A satellite positioning system (SPS) receiver comprising:
an SPS antenna which is configured to receive SPS signals;
a processor coupled to said SPS antenna, said processor determining a time of day at said SPS receiver and searching for time of arrival of SPS signals from an SPS satellite in a range determined by an estimated pseudorange to said SPS satellite, said estimated pseudorange being determined from said time of day and from a set of mathematical descriptions of estimated ranges versus time, said estimated ranges being from said SPS receiver to said SPS satellites viewable by said SPS receiver.

98. An SPS receiver as in claim 97 further comprising a communication system which is coupled to said processor, wherein said communication system receives said set of mathematical descriptions and provides said set of mathematical descriptions to said processor.

99. An SPS receiver as in claim 97 further comprising a cell based communication system which is coupled to said processor, wherein said cell based communication system receives a message specifying said time of day and provides said time of day to said processor.

100. An SPS receiver as in claim 97 wherein said processor determines a first pseudorange to a first SPS satellite when said time of day is approximate to within 10 minutes and wherein said estimated pseudorange is also determined from said first pseudorange.

101. An SPS receiver as in claim 97 wherein said estimated pseudorange is one of an estimated time of arrival of SPS signals from said SPS satellite or an estimated distance to said SPS satellite from said SPS receiver, and wherein said searching is over time intervals determined by said estimated pseudorange.

102. An SPS receiver as in claim 97 wherein said processor comprises a matched filter which performs said searching.

103. A digital processing system comprising:
   a communication interface;
   a storage device;
   a processor coupled to said storage device and to said communication interface, said processor determining an approximate location of a mobile satellite positioning system (SPS) receiver which is capable of communication with said digital processing system through said communication interface and wherein said processor determines a set of mathematical descriptions of estimated ranges versus time, said estimated ranges being from said SPS receiver to said SPS satellites viewable by said SPS receiver, said set of mathematical expressions being determined from said approximate location and wherein said set of mathematical expressions is transmitted through said communication interface to said mobile SPS receiver.

104. A digital processing system as in claim 103 wherein said approximate location is obtained from a cell based information source which is stored in said storage device.

105. A digital processing system as in claim 104 wherein said cell based information source provides approximate location information for objects in a cell of a wireless cell based communication system.

106. A digital processing system as in claim 104 wherein said approximate location represents a location of a cell object in a wireless cell based communication system.

107. A digital processing system as in claim 106 wherein said cell object is a wireless cell site in said wireless cell based communication system.

108. A digital processing system as in claim 106 wherein said approximate location is determined from said cell based information source by determining an identification of a wireless cell site which is in wireless communication with a wireless communication system which is coupled to said mobile SPS receiver.

109. A computer readable medium containing executable computer program instructions which, when executed by a data processing system, cause said data processing system to perform a method comprising:
   determining an approximate location of a mobile satellite positioning system (SPS) receiver;
   determining a set of mathematical descriptions of estimated ranges versus time, said estimated ranges being from said SPS receiver to SPS satellites viewable by said SPS receiver, said set of mathematical descriptions being determined from said approximate location;
   transmitting said set of mathematical descriptions to said mobile SPS receiver.

110. A method as in claim 84 wherein said set of mathematical descriptions comprises an estimated range to an SPS satellite and a rate of change of said estimated range over time.

111. A method as in claim 84 wherein said set of mathematical descriptions comprises a polynomial function of time.

112. A method as in claim 84 wherein said SPS receiver uses a matched filter to search for said SPS signals.

113. A method as in claim 84 wherein said SPS receiver determines said time of day from a communication signal in a cell based communication system.

114. A method as in claim 113 wherein said cell based communication system comprises a CDMA (code division multiple access) system.

* * * * *